United States Patent
Fujisaki et al.

(10) Patent No.: US 6,294,804 B1
(45) Date of Patent: *Sep. 25, 2001

(54) GAAS SINGLE CRYSTAL AS WELL AS METHOD OF PRODUCING THE SAME, AND SEMICONDUCTOR DEVICE UTILIZING THE GAAS SINGLE CRYSTAL

(75) Inventors: Yoshihisa Fujisaki, Setagaya-ku; Yukio Takano, Musashimurayama; Tsutomu Ishiba, Kodaira, all of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 08/943,593

(22) Filed: Oct. 3, 1997

Related U.S. Application Data

(62) Division of application No. 08/457,584, filed on Jun. 1, 1995, now Pat. No. 5,770,873, and a division of application No. 08/108,499, filed on Aug. 18, 1993, which is a continuation of application No. 07/780,396, filed on Oct. 23, 1991, now abandoned, and a division of application No. 07/651,040, filed on Feb. 4, 1991, now abandoned, which is a continuation of application No. 07/325,124, filed on Mar. 17, 1989, now abandoned, which is a continuation of application No. 06/783,365, filed on Oct. 3, 1985, now abandoned.

(30) Foreign Application Priority Data

Oct. 5, 1984  (JP) .................................. 59-208262

(51) Int. Cl.$^7$ .............................. H01L 29/20; H01L 29/81
(52) U.S. Cl. ............................................ 257/280; 257/289
(58) Field of Search ...................................... 257/280, 289

(56) References Cited

U.S. PATENT DOCUMENTS 5,770,873 * 6/1998 Fujisaki et al. ...................... 257/280

* cited by examiner

*Primary Examiner*—Sara Crane
(74) *Attorney, Agent, or Firm*—Antonelli, Terry, Stout & Kraus, LLP

(57) ABSTRACT

By exploiting an intense correlation exhibited between the distribution of lattice distortions in a wafer and the distribution of the threshold voltages of field effect transistors, the distribution of the lattice distortions in the wafer is reduced, thereby to mitigate the distribution of the characteristics of the semiconductor elements inthe wafer.

The difference between the maximum value and minimum value of the lattice distortions of a GaAs single crystal at a normal temperature is set to at most $4\times10^{-5}$, and the density of Si atoms contained in the GaAs single crystal is set to at most $1\times10^{16}$ cm$^{-3}$, whereby the characteristics of semiconductor elements whose parent matrial is the GaAs single crystal can be made uniform.

2 Claims, 4 Drawing Sheets

GAAS SINGLE CRYSTAL AS WELL AS METHOD OF PRODUCING THE SAME, AND SEMICONDUCTOR DEVICE UTILIZING THE GAAS SINGLE CRYSTAL

This is a division of application Ser. No. 08/457,584, filed Jun. 1, 1995 U.S. Pat. No. 08/5,770,873; which is a divisional of application Ser. No. 08/108,499, filed Aug. 18, 1993, which application is a continuation application of Ser. No. 07/780,396, filed Oct. 23, 1991, (now abandoned) which application is a continuation application of Ser. No. 07/651,040, filed Feb. 4, 1991 (now abandoned), which application is a continuation application of Ser. No. 07/325,124, filed Mar. 17, 1989 (now abandoned), which application is a continuation application of Ser. No. 06/783,365, filed Oct. 3, 1985 (now abandoned).

BACKGROUND OF THE INVENTION:

The present invention relates to the single crystal of GaAs semiconductor as well as a method of producing the same, and a semiconductor device utilizing the GaAs single crystal. In particular, the present invention is well suited to make uniform the characteristics of semiconductor elements which are fabricated in a wafer of GaAs semiconductor.

Among factors which dominate the dispersion of semiconductor elements fabricated in a wafer, those attributed to a crystal structure such as resistivity and FET characteristics have heretofore been considered to be the distribution of etch pit densities and the ununiform distribution of an impurity substance within the wafer, but they have not been clarified yet. Reports on them having hitherto been made include the following:

(1): Yoshizumi TSUNODA, Masayoshi MATSUI and Takeshi YOKOYAMA
   Collection of Drafts of Lectures in 30th Spring Symposium of Applied Physics Society (1983), 4p-D-10, p. 437

(2): Yasunobu ISHII, Shintaro MIYAZAWA, Akira ISHIDA and Hajime YAMASAKI
   Collection of Drafts of Lectures in 31st Spring Symposium of Applied Physics Society (1984), 1p-D-5, p. 633

(3): Yoshiro HIRAYAMA, Shintaro MIYAZAWA and Hajime YAMASAKI
   Collection of Drafts of Lectures in 31st-Spring Symposium of Applied Physics Society (1984), 1p-D-6, p. 633

SUMMARY OF THE INVENTION

An object of the present invention is to provide the structure of a crystal in the shape of a wafer for making uniform the electrical characteristics of semiconductor elements to be fabricated in the wafer of a GaAs semiconductor single crystal, from a novel viewpoint, as well as a method of producing the same, and a semiconductor device utilizing the crystal.

The inventors have found out that, among factors which dominate the distribution of the characteristics of semiconductor elements fabricated in a GaAs single crystal wafer, an important one attributed to a crystal structure is the discrepancy of the lattice constants of the GaAs single crystal in the wafer. For example, in case of fabricating field effect transistors (FETs), an intense correlation has been found out between the distribution of lattice distortions in the wafer and the distribution of the threshold voltages of the FETs as will be described in detail later.

The present invention is based on such new knowledge, and achieves the uniformity of the characteristics of semiconductor elements by adjusting the discrepancy of the lattice constants of a GaAs single crystal. At present, the inventors do not know any measure in which the distribution of lattice constants in a wafer is taken into consideration.

It is important for obtaining a semiconductor device satisfactorily functioning in practical use that the range of distribution in the wafer of a GaAs single crystal is set in a predetermined range.

More specifically, the discrepancy D of lattice constants at a normal temperature in a wafer as measured with a region 1–100 mm² in area taken as one unit is set as follows:

$$D/d_o \leq 4 \times 10^{-5} \tag{1}$$

(where $d_o$ denotes the lattice constant of a GaAs single crystal of its stoichiometric composition at the normal temperature (23 ±1° C.), $D=\Delta d_{max}-\Delta d_{min}$ holds with $\Delta d_{max}$ being the maximum value of $\Delta d$ in the wafer and $\Delta d_{min}$ being the minimum value of $\Delta d$ in the wafer, and $\Delta d=(d-d_o)$ holds in which d denotes the lattice constant of the GaAs wafer at the normal temperature).

In this regard, when the discrepancy in the wafer is suppressed to be too small, the production of the GaAs single crystal becomes difficult, and the reproducibility of the production might be spoilt. It is accordingly reasonable that the discrepancy in the wafer is at least $4 \times 10^{-6}$.

By the way, in case of fabricating field effect transistors or the likes with a GaAs single crystal wafer, it has been considered desirable to set the density of Si atoms of the GaAs single crystal to a value less than $1 \times 10^{15}$ cm⁻³. The inventors' study, however, has revealed that with GaAs single-crystals having hitherto been produced, the densities of Si atoms of which are not higher than $1 \times 10^{16}$ cm⁻³, none of the distributions of lattice constants in the wafers of the GaAs crystals satisfies the aforementioned equation (1) in terms of $D/d_o$ as shown by a lattice distortion distrubution curve 1 in FIG. 1.

That is, in the case of fabricating the FETs or the likes satisfactorily functioning in practical use by employing the GaAs single crystal, there has not been any GaAs single crystal which realizes the discrepancy of lattice constants in the wafer thereof as meets the aforementioned equation (1). The present invention achieves uniformity in the characteristics of semiconductor devices, e.g., the threshold voltages thereof using a GaAs single crystal the density of contained Si atoms of which is at most $1 \times 10^{16}$ cm⁻³, this value permitting the semiconductor devices such as field effect transistors to function satisfactorily in practical use, and with which the distribution of lattice constants in the wafer of the single crystal satisfies the aforementioned-equation (1).

In accordance with the present invention as described above, the distribution of the characteristics of semiconductor elements in a wafer can be sharply reduced, which can bring forth the effect of enhancing the production yields of ICs or LSIs in which the semiconductor elements are integrated at high densities. Besides, the invention is effective for the high speed operations of ICs and LSIs for the same reason.

DETAILED DESCRIPTION OF THE INVENTION

By taking field effect transistors as an example, the relationship between the discrepancy D of lattice constants in a wafer and the characteristics of the devices will be described.

Figure 1:
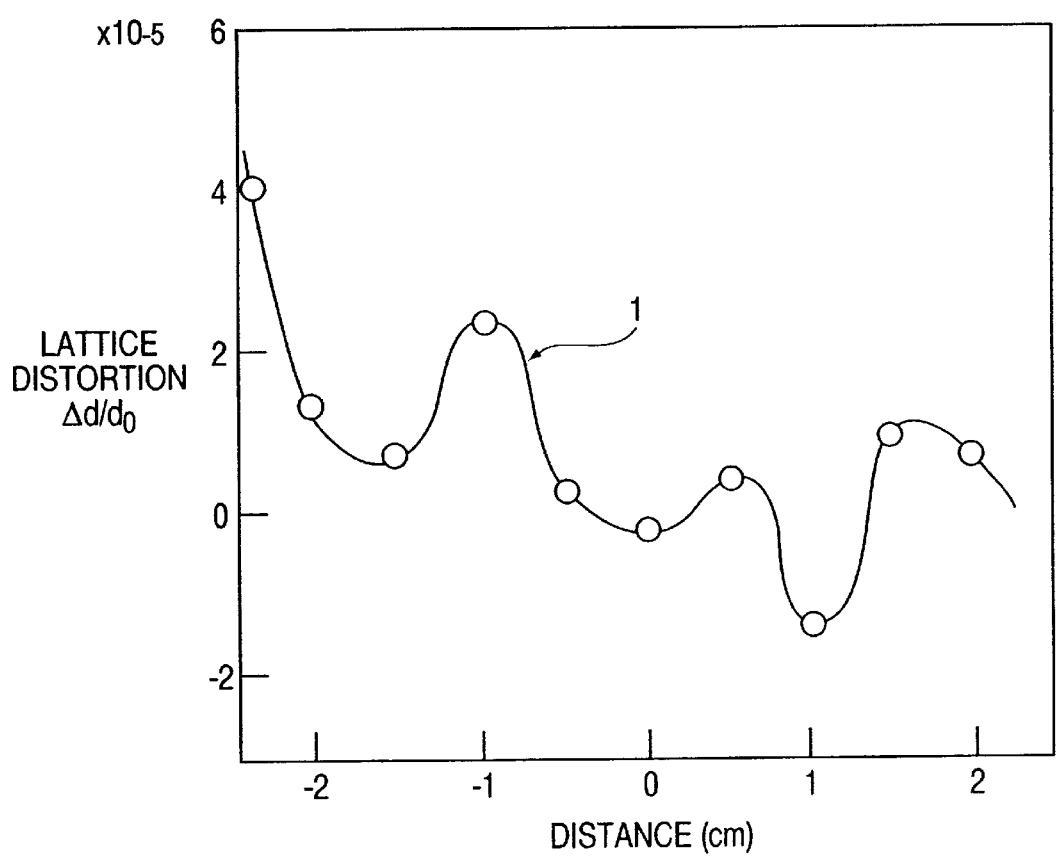
FIG. 1 is a diagram showing the lattice distortion distribution of a prior-art GaAs single crystal in a 2-inch wafer.
Figure 2:
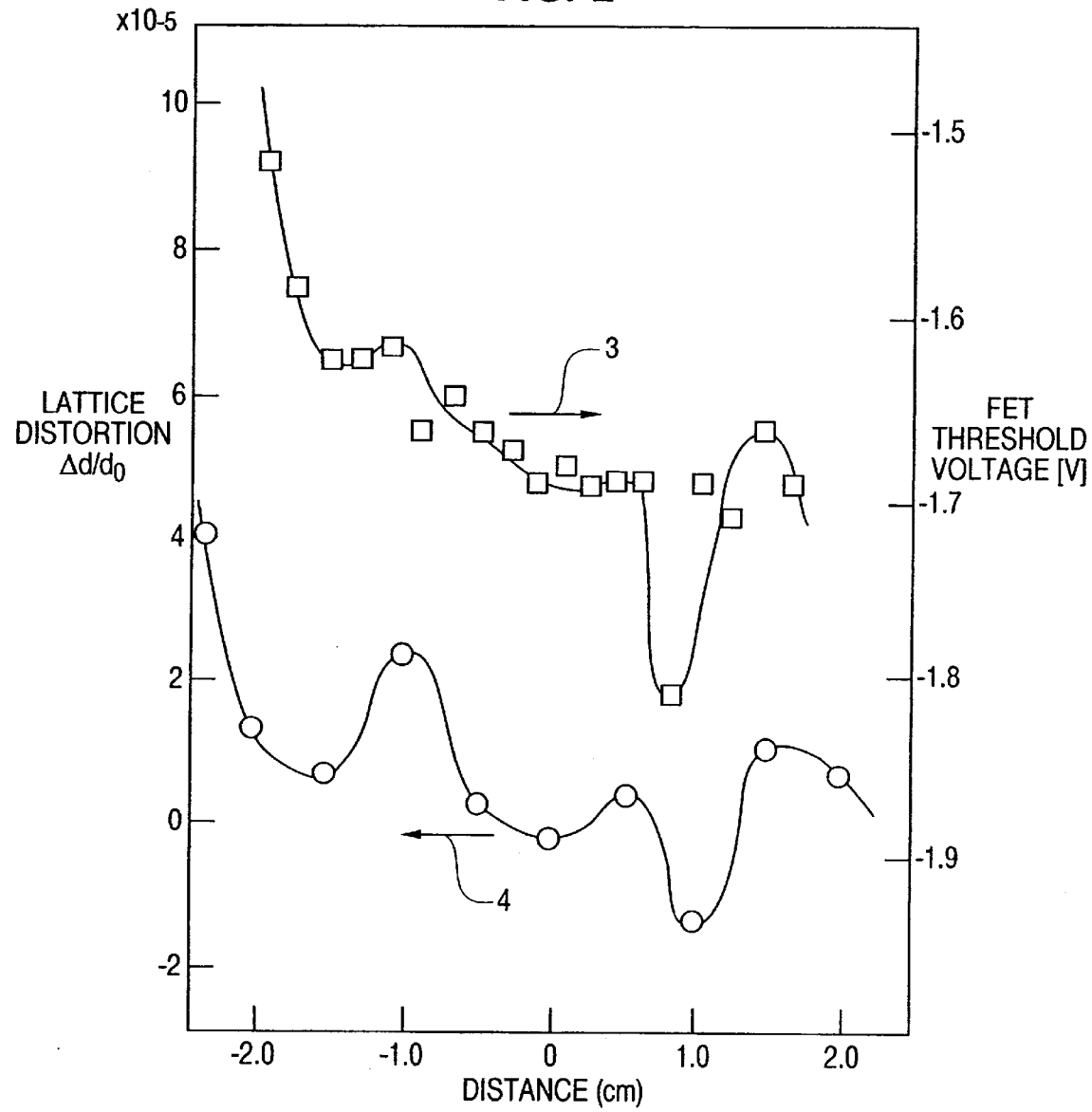
FIG. 2 is a diagram showing the threshold voltage distribution of FET elements fabricated in the 2-inch wafer, and the distribution of lattice distortions in the wafer.
Figure 3:
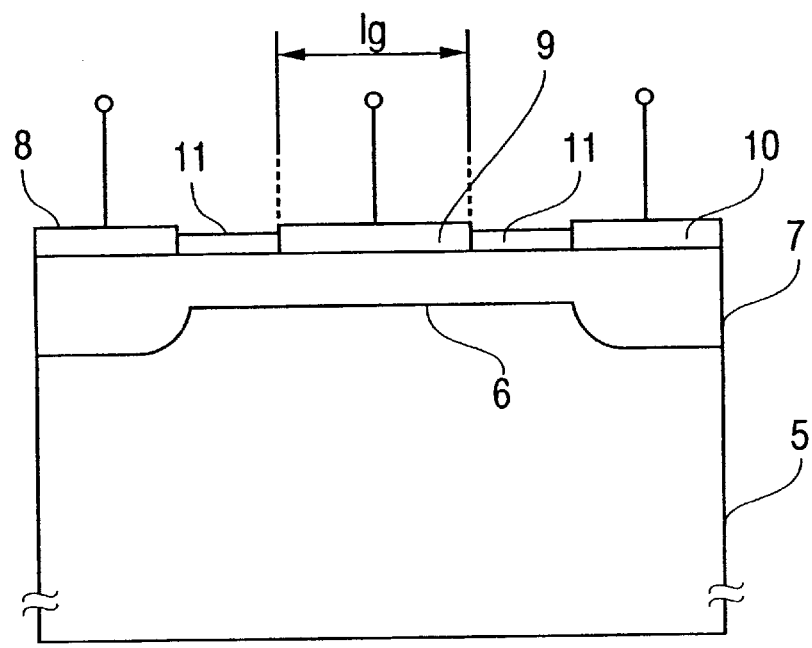
FIG. 3 is a sectional structural view of a MESFET element fabricated in a wafer in order to examine the electrical properties of the wafer.

FIG. 2 shows the correlation between the distribution in a wafer, of the threshold voltages of depletion-mode MESFETs (metal semiconductor field effect transistors) fabricated in a prior-art GaAs single crystal in the shape of the wafer and the distribution in the wafer, of the lattice constants of the identical crystal at when the normal temperature. (Here, when $d_o$ denotes the lattice constant of the GaAs single crystal of its stoichiometric composition at the normal temperature and d denotes the lattice constant of the measured GaAs wafer at the normal temperature, $D=\Delta d_{max} - \Delta d_{min}$ holds in which $\Delta d=(d-d_o)$). FIG. 3 shows the sectional structure of the MESFET which was used for the measurement of the threshold voltage distribution in FIG. 2. The method of manufacturing the FETs, itself was a hitherto known method. $Si^+$ ions were implanted into a semi-insulating GaAs substrate crystal 5 at a dose of $2.5 \times 10^{12}$ cm$^{-2}$ by an accleration voltage of 75 kV. While $SiO_2$ 200 nm thick which was formed by the CVD (chemical vapor deposition) process was used as a protective film, the substrate crystal was annealed at 800° C. for 20 minutes (in an $H_2$ atmosphere) to form an active layer 6. Numeral 7 designates a layer implanted with the $Si^+$ ions at the high density in order to form ohmic contacts. Numerals 8 and 10 indicate source and drain electrodes respectively, which were made of Au/Ni/Au-Ge. Numeral 9 indicates a gate electrode, which was made of Au/Pt/Ti and which formed a Schottky barrier junction between it and the active layer. The gate length $l_g$ of the gate electrode was $l_g=2$ μm, and the gate width thereof in a direction perpendicular to the sheet of the drawing was 200 μm. Shown at numeral 11 is a passivation film as which $SiO_2$ was deposited by the CVD process.

As apparent from FIG. 2, the distribution of the lattice distortions $\Delta d/d_o$ in the wafer (curve 4) and the distribution of the threshold voltages of the MESFETs (curve 3) have an intense correlation. The axis of abscissas in the figure represents the distance of a measured point from the center of the wafer, while the axis of ordinates represents the lattice distortion at the normal temperature and the threshold voltage of the MESFET. For observing the correlation, it is preferable to measure the lattice distortions with a region 1–100 mm² in area taken as one unit. It has been exhibited by the measured correlation that reduction in the distribution of the lattice distortions $\Delta d/d_o$ in the wafer makes it possible to remarkably reduce the deviation of the semiconductor elements in the wafer. This fact is not limited to the aforementioned MESFETs, but it similarly holds for other FETs. In order to operate at high speed a GaAs LSI which has a density of integration of 1 kB, it is required in case of employing the MESFETs that the distribution of the threshold voltages in the wafer be 50 mV or less. However, when the distribution is too small, the manufacture of the FETs becomes difficult, and the reproducibility of the manufacture is spoilt. It is accordingly suitable to set the distribution at 5–50 mV in consideration of practical use.

On the basis of the relationship between $\Delta d/d_o$ and $V_{th}$ in FIG. 2, the relationship between the distribution of the threshold voltages and the distribution of the lattice distortions will be evaluated. Standard deviations are employed as magnitudes for indexing this relationship. Between the standard deviation $\sigma V_{th}$ [mV] of the threshold voltages and the standard deviation $\sigma_D$ of the lattice distortions, the following relation holds:

$$\sigma_D = 0.265 \times 10^{-6} \sigma V_{th} \tag{2}$$

With this relational expression, $\sigma_D$ must satisfy the following in order for the threshold voltages to fall within the distribution of 5–50 mV:

$$1.33 \times 10^{-6} \leq \sigma_D \leq 1.33 \times 10^{-5} \tag{3}$$

Figure 5:
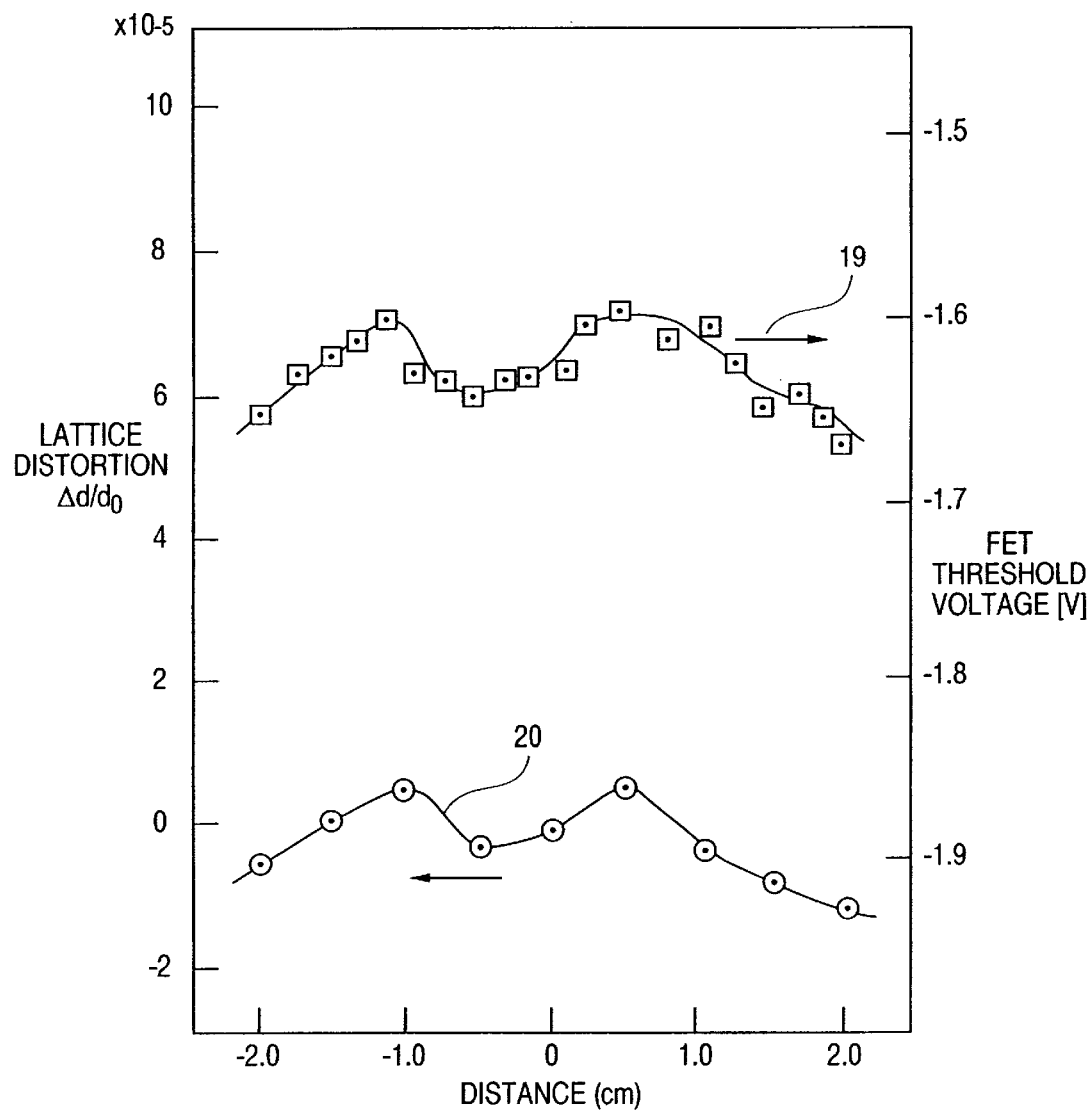
FIG. 5 is a diagram showing a lattice distortion distribution in a 2-inch wafer produced by the method of the present invention, and the threshold voltage distribution of MESFET elements fabricated therein.

In addition, as apparent from FIG. 5 showing the case of the GaAs single crystal of the present invention to be described later, the distribution of $\Delta d/d_o$ is sufficiently smooth in a wafer, so that the maximum value and minimum value of $\Delta d/d_o$ fall within a range of $3 \times \sigma_D$ from the average value thereof. Accordingly, when the following is met as the range of the values of $D/d_o$:

$$4 \times 10^{-6} \leq D/d_o \leq 4 \times 10^{-5}$$

the distribution of the threshold voltages of the MESFETs can be brought into the predetermined range of 5–50 mV.

The above threshold voltage $V_{th}$ has been defined by a gate voltage with which when a voltage of 2 V is applied across the source and drain electrodes, a drain current becomes 5 μA for a gate width of 10 μm.

Figure 4:
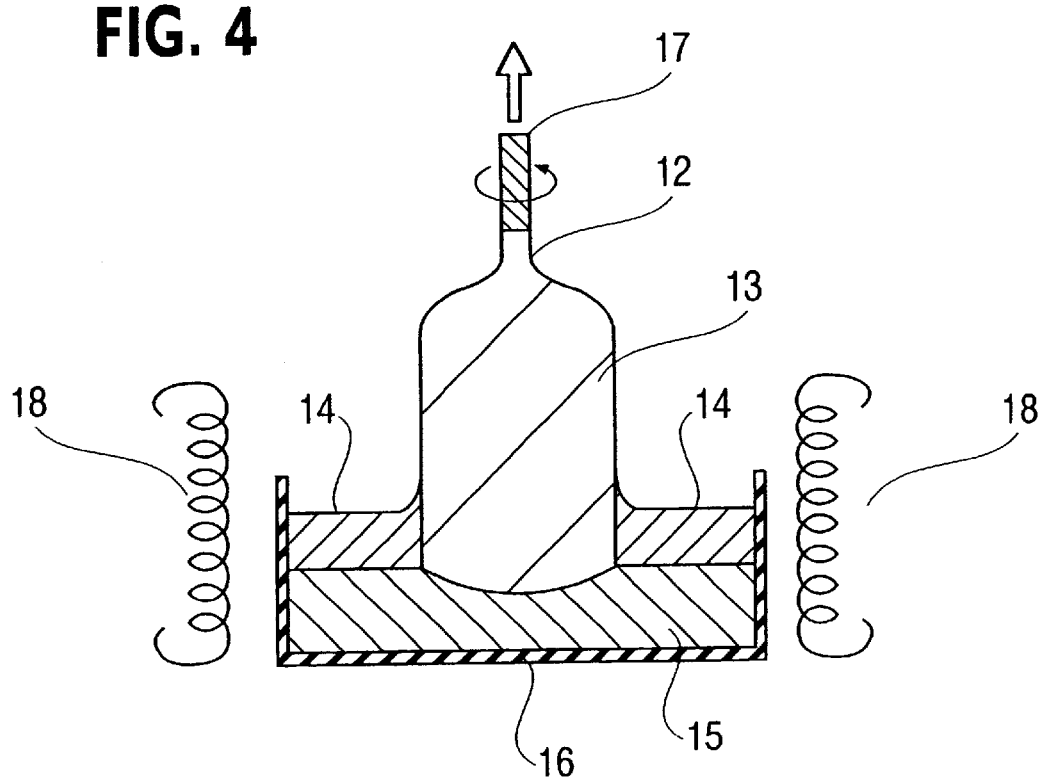
FIG. 4 is a sectional view showing a crystal growth method based on pulling illustrative of an embodiment of the present invention.

To the end of bringing the lattice distortions in the wafer $\Delta d/d_o$ into the range limited by Eq. (1) or Eq. (3), a GaAs single crystal of high purity (having an impurity concentration less than $1 \times 10^{16}$ cm$^{-3}$) was produced by the pulling method. The GaAs single crystal of the present invention, however, is not restricted to the pulling method. The method of crystal growth will be described with reference to FIG. 4. The pulling method itself may be a well-known technique, which is reported in, for example, 'Semi-insulating III–V Compound Crystal Technology' by Takatoshi NAKANISHI, Proceedings of the Institute of Electrical Communication, 66 (1983), p. 503. By controlling the conditions of the crystal growth, lattice constants are controlled. The measurement of the lattice constants suffices with, for example, well-known X-ray diffraction based on a well-known double crystal method using is a schematic sectional view which double X-ray beams. FIG. 4 is a schematic sectional view which shows the concept of the so-called LEC (Liquid Encapsulated Czochralski) method. A PBN (pyrolitic boron nitride) crucible 16 is charged with Ga and As of raw materials, which are brought into a liquid solution or melted state (15) at a temperature of approximately 1250° C., whereupon a pulling rod 17 to which a seed crystal 12 is secured is pulled up while being rotated as indicated by an arrow in the figure. Numeral 13 designates the GaAs single crystal pulled up. In the present example, the pulling rate was set at 8 mm/h, and the revolution number at 10.5 rpm. Shown at numeral 14 is a sealant $B_2O_3$ for preventing the vaporization of As. It prevents the gasification of As from the melt, and also adheres to the surface of the pulled GaAs single crystal to prevent As from coming out of the crystal. During the crystal growth, the crucible 16 was also rotated at a revolution number of 12 rpm in the direction opposite to the rotating direction of the pulling shaft 17 to the end of making the distribution of temperatures in the melt uniform. Numeral 18 indicates a carbon heater, and the rate of crystal growth can be controlled by regulating the output of the heater. Heretofore, to the end of controlling the diameter of a pulled crystal, the heater output has been regulated under such a condition that the time variation of the temperature of the melt near the center of rotation of the crucible becomes 2–5° C./min. Such a temperature variation with time, however, changes the crystal growth rate conspicuously and results in greatly affecting the distribution of the lattice distortions $\Delta d/d_o$ in the wafer. In the present example, therefore, the crystal growth was performed under a condition under which the temperature variation of the melt became 1.5° C./min. or less. As a result, the magnitudes of the lattice distortions of the produced crystal in the wafer were sharply reduced, and the crystal meeting the conditions of Eqs. (1) and (3) was prepared. According to the above method, the mixing of Si was not noted.

FIG. 5 shows the lattice distortion distribution $\Delta d/d_o$ of the GaAs wafer of high purity (residual impurity concentration: less than $1\times10^{15}$ cm$^{-3}$) and high resistance (resistivity: at least $10^8$ Ω·cm) prepared by the above method, and the distribution in the wafer, of the threshold voltages of MESFET elements fabricated therein by the foregoing method.

The axis of abscissas in the figure represents the distance of a measured point from the center of the wafer, while the axis of ordinates represents the lattice distortion $\Delta d/d_o$ at the room temperature (curve 20) and the threshold voltage $V_{th}$ [V] of the MESFET element (curve 19).

As seen from this figure, by setting the range of distribution $D/d_o$ of the lattice constants as follows:

$$4\times10^{-6} \leq D/d_o \leq 4\times10^{-5}$$

the distribution $\sigma V_{th}$ of the threshold voltages was reduced to $\sigma V_{th}=20$ mV with respect to the average value $V_{th}=1.65$ V.

The active layer of the FET element used for the estimation had a carrier concentration of approximately $2\times10^{17}$ cm$^{-3}$. Although the effect of reducing the lattice distortions is more remarkable at a lower carrier concentration, it is sufficient even for a wafer of low resistivity which has a carrier concentration of approximately $10^{17}$ cm$^{-3}$. The invention is not restricted to the FET elements, but is also effective when the resistances, threshold currents etc. of photodiodes and photosenstive elements to be fabricated in conductive crystals are made uniform in wafers.

What is claimed is:

1. A semiconductor device comprising a plurality of field effect transistors formed on a surface of a GaAs single crystal substrate, wherein said GaAs single crystal substrate has a distribution of lattice constant which satisfies the following:

$$D/d_o \leq 4\times10^{-5}$$

whereby D is defined as the value of difference between the maximum and minimum values of lattice constant within the surface of said GaAs single crystal substrate in a region the size of said GaAs single crystal substrate, and $d_o$ is defined as the lattice constant at room temperature of a stoichiometric composition GaAs single crystal being the theoretical composition of GaAs single crystal.

2. A semiconductor device utilizing a GaAs single crystal according to claim 1, wherein at least one of said field effect transistors is a MESFET.

* * * * *